(12) United States Patent
Hein (10) Patent No.: US 6,344,087 B2
(45) Date of Patent: Feb. 5, 2002

(54) BOARD COATING SYSTEM

(75) Inventor: Hubertus Hein, Munich (DE)

(73) Assignees: ITC Intercircuit Handels GmbH, Munich; Mass GmbH, Geseke, both of (DE)

(*) Notice: Subject to any disclaimer, the term of this patent is extended or adjusted under 35 U.S.C. 154(b) by 0 days.

(21) Appl. No.: 09/511,829

(22) Filed: Feb. 23, 2000

(30) Foreign Application Priority Data

Jan. 13, 2000 (DE) .......................................... 100 01 163

(51) Int. Cl.[7] .................................................. B05C 1/02
(52) U.S. Cl. ......................... 118/262; 118/249; 118/66; 118/112; 118/222; 118/227
(58) Field of Search .......................... 427/211, 96, 428; 118/227, 249, 66, 112, 203, 222, 236, 262; 198/456; 156/578

(56) References Cited

U.S. PATENT DOCUMENTS

| | | | | |
|---|---|---|---|---|
| 3,470,997 A | * | 10/1969 | Trounce | ..................... 198/456 |
| 4,493,857 A | * | 1/1985 | Knigge et al. | ................. 427/96 |
| 5,246,731 A | * | 9/1993 | Velie | ............................ 427/96 |
| 5,858,091 A | * | 1/1999 | Feldkamper et al. | ........ 118/200 |
| 5,882,469 A | * | 3/1999 | Detterman et al. | ......... 156/359 |
| 5,961,721 A | * | 10/1999 | Feldkamper et al. | ........ 118/222 |

* cited by examiner

*Primary Examiner*—Laura Edwards
(74) *Attorney, Agent, or Firm*—K. David Crockett, Esq.; Crockett & Crockett (57) ABSTRACT

Method of coating a board and a board coating system for performing the method. The inventive method is intended for coating a board with liquid coating material, particularly for coating a basis plate intended for circuit boards with liquid photoresist. Here, the plate which is to be coated is transported by a transport apparatus past a coating roller while in contact with the latter. The coating roller is rotated in a vertical orientation and, during coating, the board is held by the transport apparatus on its upper edge in a vertically hanging position and is led past the vertically oriented coating roller by the transport apparatus.

40 Claims, 8 Drawing Sheets

BOARD COATING SYSTEM

The inventions described below relate to a method for coating a board with liquid coating material, in particular for coating a basis board intended for circuit boards with liquid photoresist (photolacquer), as well as a board coating system for performing the method.

BACKGROUND OF THE INVENTIONS

In the production of multi-layer circuit boards, copper-laminated inner layers are normally coated with a photo-sensitive etch resistant. The etch resistant is exposed with an IC-original and following this, the circuit picture is developed. Since ever finer structures are required in circuit construction, it is necessary to apply the etch resistant very thinly and yet with high accuracy in the distribution of layer thickness. As clean an environment as possible is a prerequisite for this, since even the smallest particles as impurities on or in the applied etch-resistant layer can cause defects.

At the present time, there are two principal methods used for coating basis boards intended for use as circuit boards. In one, a dry film is applied to the basis plates by means of a carrier film. Following the exposure of the dry film the carrier film is then removed in order to enable the development of the board structure by means of an etching process. In another method the basis board is coated with liquid photo resistant by means of one or more coating rollers. Currently horizontal coating apparati with horizontally arranged coating rollers are employed for this purpose. Each coating roller rotates partially in a photoresist bath and is therefore uniformly moistened along its entire length with liquid coating material. The layer thickness is set by means of a doctor roller which is in contact with the coating roller and is adjustable with varying contact pressure against the coating roller. Opposite the coating roller a brace is arranged, thereby forming a pass-through gap therebetween. The brace can be formed as counterroller or as a second coating apparatus with horizontally arranged coating roller. Each board to be coated is supplied to the coating apparatus using a conveyer-belt or transport rollers and is gripped by its coating roller(s) and, if necessary, counterroller and is transported through the pass-through gap by these rollers while being coated. Following the coating the then coated board is gripped by a transport gripper and is then further transported to a next processing step, for example to the drying of the photoresist or to the exposure of the coated basis board. In the conventional coating system described for application of liquid photolacquer, disadvantages exist in that after coating of the board no uncoated free boarder exists so that a gripping apparatus of the transport gripper has to partially grip into the applied lacquer, whereby small lacquer flakes, so-called tinsels, can arise following drying of the lacquer upon opening the gripper. These flakes can lead to impurities on the basis board and hence to defects and to unusability of the later circuit board. Furthermore a skewing of the board can occur during the drawing-in of the base board between the rollers, something which is also detrimental to the accuracy of the coating. Since furthermore, the coating roller is at the same time also used for the transport of the basis board, a corresponding contact pressure against the board is required which also influences the coating thickness, so that its exact setting becomes on the whole more difficult. Furthermore a change of the board format causes problems in that the transport system must be configured to various widths of basis boards. This is because it is typically formed out of transport grippers which grip the board on opposite edges. The gripping of the board and its advancing to the rollers makes for further difficulties in that the boards cannot be correctly gripped by the gripping apparati or by the rollers, since these can exhibit warping. This is especially the case when the boards are intended for intermediate circuit layers and are formed very thinly. In production, this can lead to backups and/or to defective products.

SUMMARY OF THE INVENTIONS

The devices and methods described below provide a method as well as a board coating system of the type mentioned at the start, by means of which boards of the most different formats can be coated easily with improved quality and at the same time higher productivity.

According to the inventive method for the coating of a board with liquid coating material, in particular for coating a basis board intended for circuit boards with liquid photo resist, the board, in contact with a coating roller, is transported for coating past the latter by a transport apparatus. The coating roller here is rotated in a vertical orientation and the board, held by the transport apparatus on its upper edge in a vertically hanging position, is passed by the vertically oriented coating roller during coating. In addition to the production of circuit boards the method can also be employed for the production of other coated boards, like table or other furniture boards made of wood, steel or synthetic material as well as for construction and paneling boards.

With this method, boards of the most different formats can be coated error-free in a rapid and exact manner. The maximal board format is restricted only by the length of the coating roller whereas, with this as a starting point, any smaller boards are coatable without adaptation of the associated transport apparatus. This is because the boards can constantly be transported past the rollers at a constant height level, whereby the part of the board extending along the coating roller in its length is arbitrarily variable up to the maximum length of the coating roller. In that the boards, guided by the transport apparatus, are transported past the coating roller, a more exact coating is possible than if transport were to occur by means of the rollers themselves.

In order to achieve an even faster production process, the board in one preferred embodiment of the invention is in its supply to the transport apparatus, simultaneously gripped by the latter along the entire upper edge and/or in the removal from the transport apparatus the board is simultaneously released along its entire upper edge. To this end, the transport apparatus and an automatic board supply/or a board removal apparatus are formed accordingly.

Further, in order to ensure a smooth production process, the board which is to be coated is advantageously supplied to the transport apparatus through a funnel-shaped, tapered introduction shaft, thereby straigtening the upper edge of the board, which edge is to be gripped by the transport apparatus.

In order to further accelerate the production process during coating, following the coating process the board, gripped on its upper edge by the transport apparatus, is advantageously guided through a drying apparatus in a vertically hanging position in order to dry the applied coating material.

Particularly in the production of a circuit board, it is necessary that the photoresist applied to the board is cooled down to a suitable temperature prior to the exposure process. In order to accelerate the production process as a whole, following the coating process the board in the inventive coating method, gripped on its upper edge by the transport apparatus, is guided in a vertically hanging position through a cooling apparatus to cool the applied coating material. For the case that the board is to be coated on both sides, the board in the coating process is simultaneously coated on both sides by two coating apparati, which reduces the coating time.

To prevent the coating material from running off of the board, the coating material to be applied is preferredly set to a predetermined viscosity by cooling and/or heating.

The coating result can be further improved by heating the board which is to be coated prior to the coating process. To this end a heating source, for example an infrared heat radiator, can precede the coating apparatus. Furthermore the coating can be qualitatively improved by cleaning the boards prior to the coating process.

The board coating system for performing the inventive method is in particular intended for the coating of basis plates, themselves intended for circuit boards and multi-layer internal layers, with liquid photoresist. However, it can also be used for the coating of other boards like table or other furniture boards made of wood, steel or synthetic material as well as for construction and paneling boards. It contains a coating apparatus which itself contains a coating roller for applying the coating material to one side of the board and a supply device for suppling the liquid coating material to the coating roller. The board coating system further contains a brace which is arranged opposite the coating apparatus and which, during the coating, acts from the other side of the board against the force applied to the board by the coating roller. The board coating system further contains a transport apparatus by which, during the coating, the board, in contact with the coating roller, is transported through a gap between the coating roller and the brace. The coating apparatus is formed as a vertical coating apparatus with a vertically oriented coating roller and the transport apparatus is formed such that the board, gripped on its upper edge in a vertically hanging manner by the transport apparatus is led past the coating roller in this vertically hanging position to be coated.

Due to the vertical orientation of the coating roller and the hanging transport of the boards throughout the transport apparatus, boards of different formats can be coated without any sort of adjustment of the transport apparatus. Here, the maximal board format is still restricted by the length of the coating roller, however smaller boards can alternatively be coated and without any change of the system. This is because smaller boards are coated by the respective upper roller portion, while the roller portion below this rotates out of contact with the board, hereby the production process is not affected. With this, an increase in productivity is achieved due to reduced standstill times. Furthermore, since the transport system continuously, i.e. also during the coating process, guidingly transports the boards, the boards to be coated are guidingly transported past the coating roller so that a more exact coating is made possible. Since furthermore the board is hangingly transported on one edge, it can be transported through the coating apparatus with this edge projecting from the latter, by which a coating of this edge in connection with an engagement of the transport apparatus on a coated portion of the board can be avoided. In this way tinsel can be avoided, ultimately leading to fewer rejection products and higher productivity.

The supply apparatus for supplying the liquid coating material to the coating roller can be formed in the shape of a coating roller or of a spray device, by which the roller can itself be coated in advance before coating the board. Preferably the supply apparatus contains a receiving space in which the liquid coating material, i.e. for example the photolacquer or photoresist is received, and in which the coating roller rotates longitudinally of a circumferential portion. The coating roller thus rests circumferentially partially in a liquid bath which ensures a continuously sufficient supply of coating material.

The coating roller can be driven synchronously with board advance so that between the board which is transported past the coating roller by the transport apparatus and the coating roller only a roller contact is given. The coating roller can, however, be turned faster or slower relative to board advance to adjust the layer thickness so that between the coating roller and the board which is led past, and which rests in contact with the coater roller, a relative movement arises which leads to a stroking application of the coating material onto the board. In this way, a thicker application can be achieved by rotating the coating roller faster than the advance of the board, while a thinner coating thickness can be achieved by a slower rotating of the coating roller with relatively faster board transport. The coating roller can be rotated not only in the direction of the movement of board transport, but also counter to this movement. This latter aspect is advantageous for, for example, achieving highly exact coatings with low layer thickness.

Adjustment of layer thickness preferentially occurs using a doctor roller which rests on and rotates counter to the coating roller. By varying the contact pressure between the doctor- and the coating roller, the amount of fluid outwardly transported by the coating roller, and therefore the depth of the layer applied by the coating roller can be adjusted. In place of the doctor roller one could also use a stripper resting on the coating roller, by which the coating material carried on the coating roller is glidingly stripped to the desired height.

The receiving space into which the liquid coating material is received can be formed by the case vessel in which the coating roller and the doctor roller are circumferentially partially arranged in a vertical position. A longitudinal and frontal seal of the vessel against the rollers can, for example, be accomplished by a lip seal pressed against the latter. According to a preferred embodiment, the board coating system contains the following components: a vertically oriented doctor roller which rests on the coating roller, and which is adjustably arranged with varying contact pressure against the coating roller to adjust the coating thickness, a vertically arranged corotating roller which sealingly rests on the coating roller, and which is arranged at such a distance from the doctor roller that between the corotatory roller, the doctor roller and the coating roller a tri-laterally closed cavity is formed, a sealing roller arranged in contact not only against the doctor roller, but also against the corotatory roller while sealing the cavity sidewise, and a frontal seal, by which the cavity on the underfrontal side of the roller is sealed while forming the receiving space for the liquid coating material.

In that the receiving space is bordered by four rotating rollers, a continuous and thereby gentle mixing of the coating fluid contained in the receiving space takes place. By adjusting the contact pressure existing between the rollers, the required imperviousness of the receiving space can be ensured. The rollers can be made of the most varied metal or synthetic materials. The coating roller and the sealing roller are preferredly formed as rollers coated with a synthetic material, in particular with soft synthetic material or rubber. The roller core is preferredly made of steel. In contrast, the doctor roller and the corotatory roller are preferredly embodied as complete steel rollers. The rollers coated with synthetic material yield slightly at the contact points to the relative to them harder steel rollers so that a sealing effect is achieved. The outer surface of the coating roller can be structured so that a predetermined layer pattern can be applied to the board.

The contact pressure which the respective rollers exert on one another is preferably adjustable. To this end both of the steel rollers in a preferred embodiment are provided with positionally adjustable axes, while the sealing roller and the coating roller are outfitted with fixed axes. For the adjustment of the required contact pressure against the coating roller and the sealing roller, it is especially preferred that the doctor roller and the corotatory roller are repositionably arranged in a direction which is perpendicular to the connection line between the axis of rotation of the sealing roller and the axis of rotation of the coating roller. In this way an identical pressure increase or pressure decrease can be achieved by the steel roller on each of the sealing roller and the coating roller. As explained above, the doctor roller is especially provided variably in its contact pressure against the coating roller in order to set the layer thickness. Since by varying contact pressure against the coating roller the contact pressure against the sealing roller is simultaneously varied, insufficient sealing between the doctor roller and the sealing roller may arise. This can be hindered in that the sealing roller is firmly pressed against the doctor roller in advance in such a manner that the contact pressure is always sufficiently large, even in the case of a reduction as part of an adjustment. It is preferably provided that the sealing roller and the doctor roller each turn on their contact points in the direction of the receiving space so that the liquid coating material is conveyed back into the receiving space by this rotatory motion. In this way sufficient sealing of fluid is ensured, even at a low contact pressure between the doctor and the sealing roller. Furthermore a catching vessel can also be provided under the rollers by which any leakage is caught and returned to the receiving space through conduits. The rollers can have various diameters; however, in order to avoid wear they are preferably formed such that they only roll off of one another. This also reliably prevents the occurence of abrasion particles which could find their way into the receiving space and contaminate the coating material. It is further preferred to form the doctor roller and the corotatory roller of identical diameter so that the coating roller is arbitrarily exchangeable with a freely chooseable diameter.

The fluid level in the receiving space would decrease rapidly due to the continous removal of coating material by the coating roller, thereby complicating a complete and therefore exact coating of the board. The fluid level can be held constant by a constant regulated supply of coating material into the receiving space. The regulation can, for example, be achieved by a sensor arranged in the receiving space, which detects the fluid level, and whose signals are sent back to a supply pump which then itself transports the amount of coating material diverted by the coating roller out of its supply container into the receiving space. According to a preferred embodiment the supply apparatus comprises a supply container for liquid coating material from which coating material is supplied to the receiving space, and an adjustable overflow for setting the fluid level in the receiving space, over which overflow the excess coating material is recycled to the supply container. The overflow forms a simple device for setting the fluid level, which occurs by a corresponding height arrangement of the overflow. Furthermore a continuous circulation of the fluid located in the receiving space can be achieved by the overflow in that the resupplied coating material is retransported into the receiving space from below.

It was determined that the liquid coating material applied to the board, for example the photoresist or the photolacquer, does not run down on the board if it has a viscosity of 500 to 1200 mPa per second and layer thicknesses of 4 to 100 $\mu$m, despite the vertical orientation of the coating roller(s). Such running down would otherwise lead to a non-uniform distribution in layer thickness. In order to maintain the viscosity more reliably at these desired values, the receiving space according to a preferred embodiment, is outfitted with a cooling and/or a heating apparatus by which the liquid coating material contained therein can be cooled or warmed for adjustment of its viscosity. Whether a heating or a cooling apparatus, or both together, are employed depends on the coating materials used and the dependence of their viscosity on temperature. For this purpose the cooling and/or heating apparatus is preferably regulated by a thermostat. Another possibility to adjust the viscosity consists of supplying a certain amount of solvent to the liquid coating material depending on the desired viscosity. The desired viscosity of the coating material can then be maintained by a regulated supply of solvent.

Of the four rollers of the coating apparatus, one or more can be driven. Preferably each of all four rollers is simultaneously driven by the driving apparatus, avoiding wear which would otherwise result from the fact that the rollers would drive each through rolling contact. Driving can occur by any type of motor: preferably an electric motor is provided which is connected with the individual rollers by gearing. To this end gears, engaged with one another for driving the rollers, can be connected to each of the rollers. Furthermore the rollers can also be rotatingly connected with one another through a belt or, preferably, through a more exact chain drive.

For large required layer thicknesses and/or low viscosities of the coating material, the coating roller is preferably obliquely arranged with respects to the board to be coated with upwardly increasing separation from the board.

In this way a greater layer thickness is initally achieved in the upper portion of the board, which is then compensated by a slow running of the liquid down the board to the desired uniform layer thickness. Alternatively or additionally to this the coating roller can be patterned on its other surface in such a way that the liquid coating material is transported upwardly on the outer surface of the coating roller by the rotating motion of the latter. This can, for example, be accomplished by a helical chamfer or groove in the outer surface of the coating roller. In order not to affect the layer applied to the board this transport structure is, in contrast to the pattern with which patterned layers are applied to the board, provided in a microscopic size.

Alternatively to the inclined orientation of the coating roller, the doctor roller can also be located upwardly inclined away from the coating roller so that, towards the top, it is pressed with decreasing pressure against the coating roller. In this way more coating material is carried outwardly out of the receiving space by the coating roller and is applied to the board so that the previously described effect is also achieved. The brace can be formed as a brace belt or as a brace bar. However, in order to avoid board damage, particularly of the basis boards intended for circuit boards with thicknesses on the order of tenths of a millimeter, a brace roller is preferably provided as a brace which turns via rolling contact with the advance of the board or is advantageously driven itself.

According to another embodiment a second coating apparatus is provided as brace which is formed in a manner corresponding to the first coating apparatus. In this way the board is simultaneously coatable on both sides.

Although the coating apparatus and the brace can be fixedly arranged, thereby forming an intermediate gap of constant size, the coating apparatus and the brace are preferably adjustably arranged perpendicular to the board, i.e. to its direction of transport. In this way in the production of coated boards, the coating apparatus and the brace can be arranged prior to the coating process in such a separation from one another that a coating of the brace by the coating roller and a subsequent undesired coating of the board by the brace can be avoided. As soon as the board is transported to the coating apparatus from the transport apparatus, the coating apparatus and the brace can be moved towards one another, whereby coating can take place. The contact pressure can be further adjusted by the positional adjustability of the coating apparatus and/or of the brace, representing a further possibility for adjusting the layer thickness.

The transport apparatus can for example be formed as a transport trolley which is moved sideways along a transport path by the coating apparatus. The transport car can be outfitted with a bracket on which a grip apparatus is located for attachment of the board to be transported. The transport apparatus is, however, preferably formed as a transport apparatus lying completely on top which advantageously extends above the system components by which the board is processed, as for example the coating apparatus. Here, the transport apparatus preferably extends out continously from a board supply apparatus to a board removal apparatus.

The location of the transport apparatus laying on top allows monitoring, maintenance and/or cleaning work on the coating apparatus to be performed from the side without hinderance. In this way standstill times of the system are reduced, whereby the productivity of the system is increased.

In order to make more reliably possible that the board is transported to the rollers and to further processing stations in as unwarped a manner as possible, the transport apparatus is preferably formed so that the board is gripped along its entire upper edge by the transport apparatus. By gripping along the upper edge, however, is to be understood not only a continous gripping, but also a pointwise gripping along the entire upper edge which occurs in increments.

In order to more rapidly supply boards to and remove boards from the coating system, an automatic board supply and/or an automatic board removal is preferably provided from which boards are supplied to the transport apparatus and removed from it.

According to an advantageous embodiment, the board supply apparatus comprises a board introduction shaft through which the boards are supplied to the transport apparatus. Towards the top the board introduction shaft is formed in a tapered funnel-shaped manner and discharges immediately adjacent to the gripping apparati of the transport apparatus. By feeding the respective board through the tapered shaft, any shifting or other irregularities of the board on its edge to be gripped by the transport apparatus can be straightened, whereby a transition to the transport apparatus can be ensured free of interruptions. In this way transport backup and rejection products can be avoided.

The transport apparatus can be transformed in such a way that each board, upon hanging on the transport apparatus, is gradually gripped along the upper board edge by the grip apparati according to the zipper principle. However, in order to accelerate the overall production process and thereby increase productivity, the board supply apparatus and the transport apparatus are preferably formed such that the respective board, upon hanging on the transport apparatus, is simultaneously gripped along the entire edge of the board by the transport apparatus. Such is correspondingly preferably provided for the board removal apparatus with respect to the releasing of the board from the transport apparatus.

Trollies on tracks with gripping apparati attached thereto are possible examples of a transport apparatus. A preferred transport apparatus is, however, a circulating transport chain, to whose chain members the gripping apparati are attached. The transport chain represents an economical transport means which in addition is driveable by a pinion in an easily regulated manner. The transport chain is preferably turned around two chain wheels whereas it is normally positioned to be freely moveable in its longitudinal direction. The driven chain wheel and the chain drive, which is preferably provided as an electric motor of regulated rotational speed, are preferably located in the board removal apparatus. Here, the driven chain wheel is provided in a fixedly installed manner, whereas the other turn-around chain wheel is provided in the board supply apparatus in a positionally adjustable manner for maintaining chain tension. The grip apparati can be formed as electronically controlled motorized grippers which, according to the control, open or close. Simple mechanical gripping parts are provided as preferable grip apparati which are biased by spring action in the closing direction and which can be opened by mechanical actuation. The simultaneous opening of multiple such mechanical gripping parts can, for example, be caused by a bar which can simultaneously be pressed against multiple gripping parts located on the transport chain, thereby opening the same. In order to ensure a more rapid production process the board supply apparatus and/or the board removal apparatus, however, comprises an opener chain which is oriented parallel to the transport chain and which circulates with its speed, the opener chain comprising on its links attached force plungers. To open the grip parts, the opener chain with its force plungers is pushed against the grip apparati, whereby the spring-biased grip parts of the grip apparati are opened via a mechanism. In this way boards can be sequentially supplied to and removed from the transport apparatus with a continously circulating transport chain, which reduces the production time for coated boards. Pressing of the opener chain can, for example, be caused by means of electric motor or by means of a pneumatic cylinder.

A drying apparatus for drying the coating material applied to the board by the coating apparatus is preferably provided to accelerate the drying process of the applied lacquer, wherein the board, gripped on its upper edge by the transport apparatus, is transported through the drying apparatus in a vertically hanging position.

It might be required that the board runs through the processing step following the coating with a coating material temperature which is less than the coating material temperature after the coating and/or after the drying. For this reason, according to an embodiment, the board coating system is outfitted with a cooling apparatus for cooling the coating material applied to the board by the coating apparatus, wherein the board, gripped on its upper edge by the transport apparatus, is transported through the cooling apparatus in a vertically hanging position. This is especially the case for basis boards intended as circuit boards which, after coating with photoresist, are normally advanced to the exposure process with photoresist cooled to room temperature.

An optionally provided cleaning of the board is carried out in a cleaning apparatus preceding the coating apparatus, which cleaning apparatus preferably comprises a cleaning roller which is in contact with the board transported past and adhesive roller which rolls off of the cleaning roller, which adhesive roller picks up and holds particles which are possibly picked up from the board by the cleaning roller. For the case that both sides are to be coated, a cleaning apparatus is advantageously provided on both sides of the board. The transport apparatus also preferably extends above the cleaning apparatus so that the latter is also freely accessible from the side without hinderances. The transport apparatus is formed such that the board is transported by it through the cleaning apparatus in a vertically hanging position.

BRIEF DESCRIPTION OF THE DRAWINGS

In the following inventive devices and methods are explained with the help of preferred embodiments with reference to the drawings.

In the drawings.

DETAILED DESCRIPTION

Figure 1:
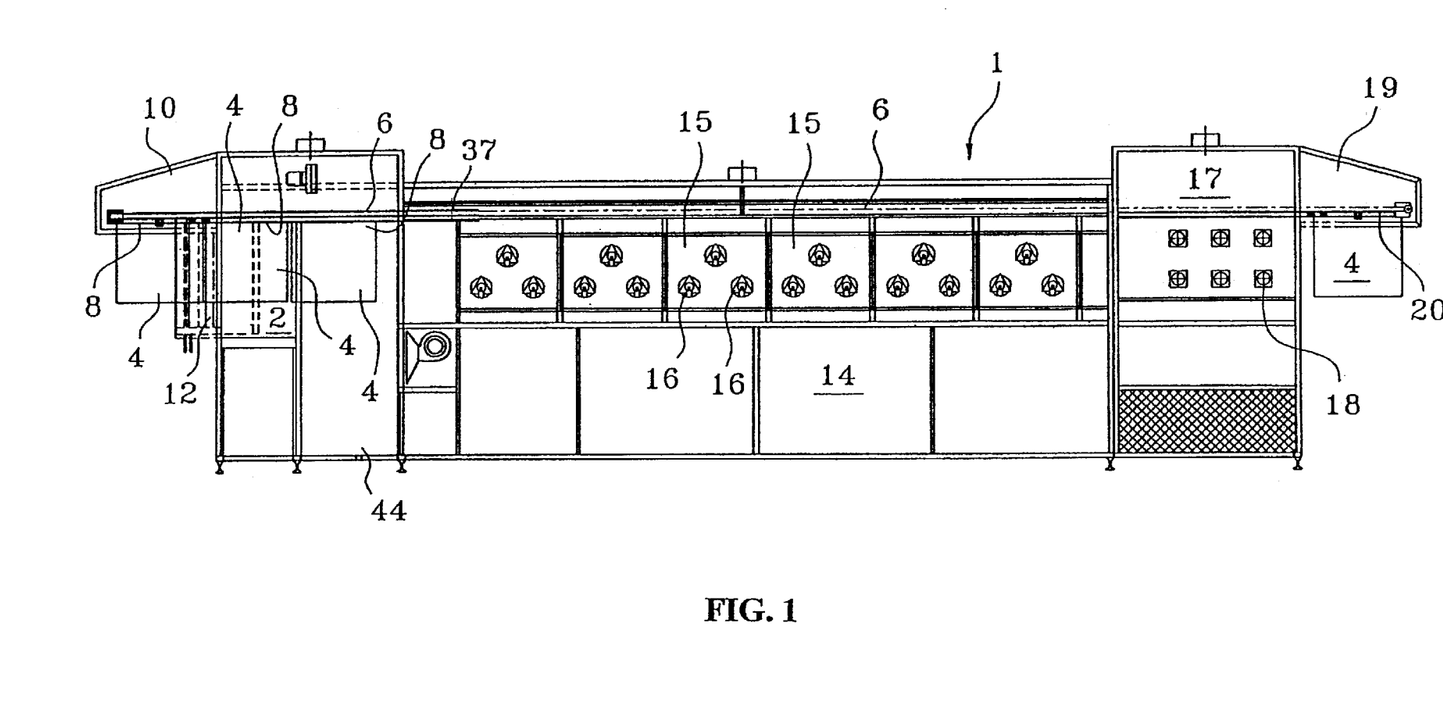
FIG. 1 shows a side view of a preferred board coating system for performing the inventive method.
Figure 2:
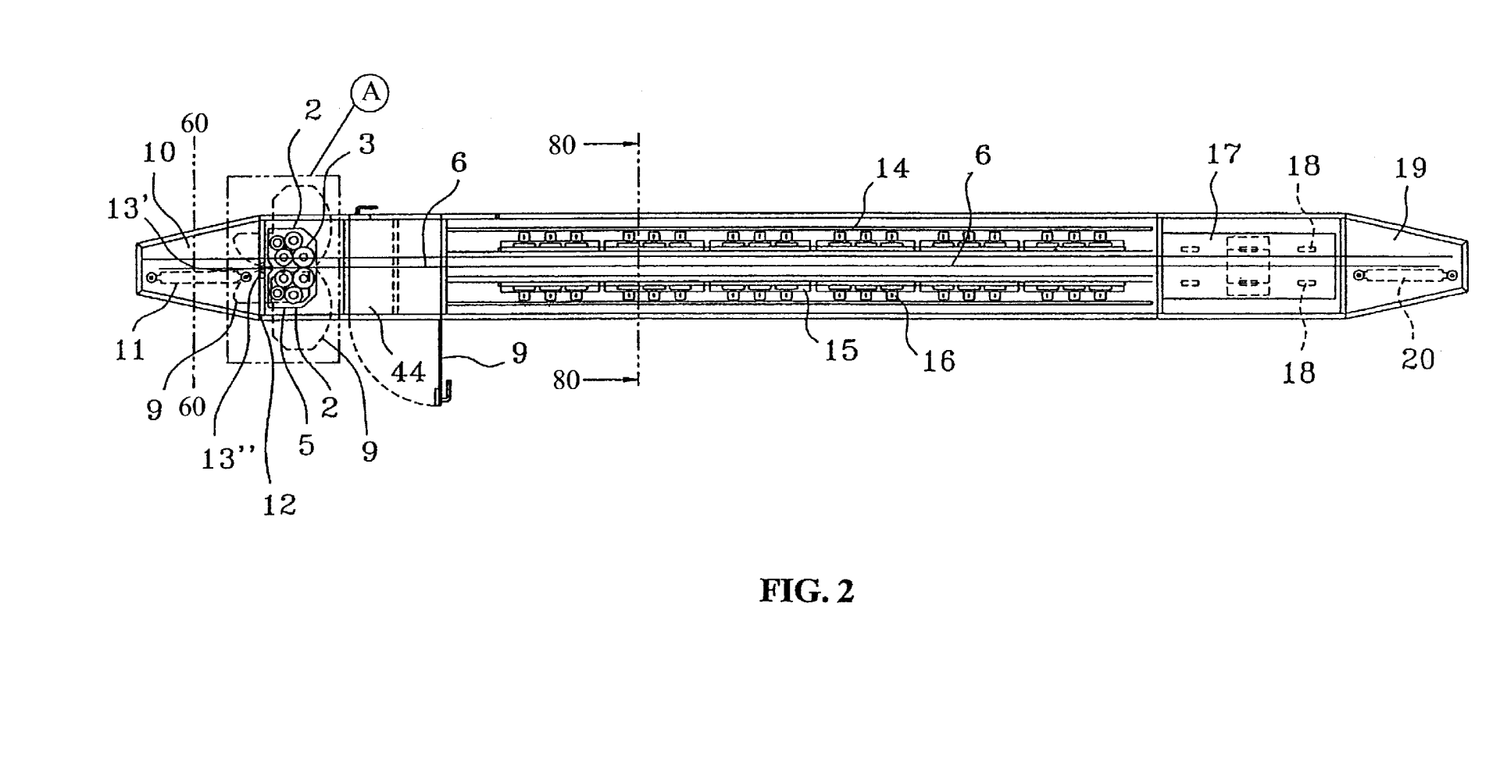
FIG. 2 shows an overhead view of the board coating system from FIG. 1.

A side view and an overhead view of a preferred coating system 1 for performing the inventive method are depicted in FIGS. 1 and 2, respectively. The depicted board coating system 1 is intended for the coating of basis plates intended for circuit boards and/or circuit board inner layers with liquid photoresist, i.e. photolacquer. According to FIGS. 1 and 2 the board coating system 1 comprises the following components: A coating apparatus 2, which is formed as roller-coater with a coating roller 3 (see FIG. 2) for application of the photolacquer to one side of the board 4 which is to be coated. The coating roller 3 is supplied with photolacquer by a lacquer supply device which is described later in more detail, which photolacquer it then transfers via rolling motion to the board transported past, which is contact with the coating roller. The board coating system 1 further comprises a brace 5, which is located opposite to the coating apparatus 2 and which, during coating, presses against the board 4 from the other side thereof in order to act against the pressure applied to the board 4 by the coating roller 3. The board coating system 1 further comprises a transport apparatus 6 by which, during coating, the board 4, in contact with the coating roller 3, is transported through a gap 7 (see FIGS. 3 and 5) between the coating roller 3 and the brace 5. As can be seen in FIGS. 1 and 2, the coating apparatus 2 is formed as a vertical coating apparatus with vertically oriented coating roller 3. Furthermore the transport apparatus 6 is formed such that, from it, the respective plate 4 can be gripped on its upper edge 8 in a vertically hanging manner and in this vertically hanging position can be led past the coating roller 3 for coating. This means that, while it is coated by the coating roller 3, the plate 4 is guidingly transported past the coating roller while continually hanging from its upper edge on the transport apparatus 6. In this way, and in contrast to the scenario in which transport is simultaneously effected by the coating roller, an exact guiding of the board during coating is obtained, whereby a high accuracy is achieved in the coating.

As can be seen in FIG. 1 the transport apparatus 6 is arranged above the coating apparatus 2 and therefore above the rollers 3, wherein the upper edge of the board 4 is not led through the roller gap 7 (illustrated in FIG. 3) and is therefore not coated. Following coating, the board 4 may not be gripped at any other location, in particular at no lacquered location, for further transport so that a damaging of the applied lacquer layer in connection with the occurence of tinsels is avoided which otherwise may lead to contaminance on or in the lacquer layer and therefore defects in the later circuit board. In that transport of the board 4 through the coating apparatus 2 continually takes place by means of the transport apparatus 6, i.e. without the board 4 first having to be supplied to the coating roller 3, grabbed by this for further transport, and finally grabbed once again by a further transport apparatus, an acceleration of the production process is achieved.

In that the transport apparatus 6 is located above the coating apparatus, doors 9 and/or glass viewing windows can be installed sidewise in the coating apparatus in an easy manner, whereby the monitoring, the cleaning and the maintenance of the coating apparatus is simplified.

The coating system 1 further comprises an automatic board supply device or loading station 10 which, seen from the direction of board transport, is located in front of the coating apparatus 2 (in FIGS. 1 and 2 left of the coating apparatus 2). The board supply apparatus 10 has a vacuum holder (vacuum aspirator) which is not depicted, with which the boards transported to the coating system 1 are drawn by suction and are brought into a vertical position. Furthermore the vacuum holder can perform a vertical lifting motion in order to supply the board upwardly to the transport apparatus 6, by which it is then gripped in this vertical position on its edge. For grabbing the board, an opening apparatus in the form of an opener chain 11 is provided in addition to the transport apparatus 6, by means of which, as is explained later in detail, the edgewise gripping of board 4 by the transport apparatus 6 takes place.

After hanging the board 4 on the transport apparatus 6 a pre-cleaning of board 4 takes place, for which a board cleaning station 12 is interposed between the loading station 10 and the coating apparatus 2. The cleaning station 12 comprises on each of both sides of the board 4 two cleaning rollers 13', 13", whereby each one collector roller 13' which rolls off of the board 4, which board is transported past by the transport apparatus 6, for the collection of particles, and each one adhesive roller 13" which rolls with the collector roller 13' and upon which the particles collected from collective roller 13' remain stuck.

A drying apparatus 14 is connected to the coating apparatus 2. The drying apparatus 14 comprises multiple drying elements 15 with heat sources 16 connected thereto, for example infrared heat radiators. The transport apparatus 6 extends along the drying apparatus 14 above the same, whereby, during drying of the applied lacquer, the board 4 continues to be moved through the drying apparatus 14 in a vertically hanging position by the transport apparatus 6.

The transport apparatus 6 is constructed with a linear transport path, wherein the drying or heating elements 15 are sequentially lined up along the straigtline transport path. The transport apparatus 6 can, however, also describe a curved transport path, which, depending on the local conditions and on the arrangement of the other system parts, can be advantageous or necessary. Since, according the present example embodiment, the board 4 is coatable on both sides, heating elements 15 are arranged on both sides of the transport path and thereby on both sides of the board 4. Here the drying apparatus takes up about half of the total length of the board coating system 1 which total length according to this embodiment runs on the order of 10 meters. The length of the drying apparatus 14 (and therefore the total length of the system 1) depend, however, on the planned board throughput. This means that if plates 4 are to be transported faster (higher throughput), then the drying apparatus 14 is to be correspondingly lengthened in order to ensure the timely drying of the coating material 29.

Following the drying apparatus 14 a cooling apparatus 17 is provided in which multiple cooling elements 18 are located. Ventilators are provided as cooling elements 18 according to this embodiment, by which a cooling space is ventilated with filtered ambient air in order to cool the boards 4, which are transported through the cooling space, down to about room temperature. The cooling elements 18 can additionally be outfitted with cooling aggregates in order to cool down the ambient air supplied to the cooling space in order to in this way accelerate the cooling of the board 4. The transport apparatus 6 is located above the cooling elements 18 in an extended manner so that than the board 4, hanging in a vertical position on the transport apparatus 6, is transportable through the cooling apparatus 17. In the present example embodiment cooling elements 18 are located on both sides of the transported board 4 in order to uniformly cool down the photolacquer applied to both sides of board 4. With regard to the required length of the cooling apparatus 17, corresponding considerations apply as with the drying apparatus 14.

In the drying apparatus a continous, regulated exchange of the warm air located in the drying apparatus 14 with freshly supplied filtered and newly heated or still-to-be-heated air is provided in order to prevent an enrichment of the air surrounding the board with solvent vapors. Here the volume stream of the used air is measured and is supplied to a ventilator motor as regulating variable. The boards 4 which are to be dried can also optionally or in combination be dried with supplied warm air instead of with infrared heat radiation. An insulation surrounding the drying space prevents an unnecessary dissipation of heat energy to the environment.

An automatic board removal apparatus 19 is connected to the cooling apparatus 17, which automatic board removal apparatus 19 is formed according to the board supply apparatus 10 and, accordingly, comprises an aspirator arm which is not depicted and an opening apparatus in the form of an opener chain 20.

Figure 3:
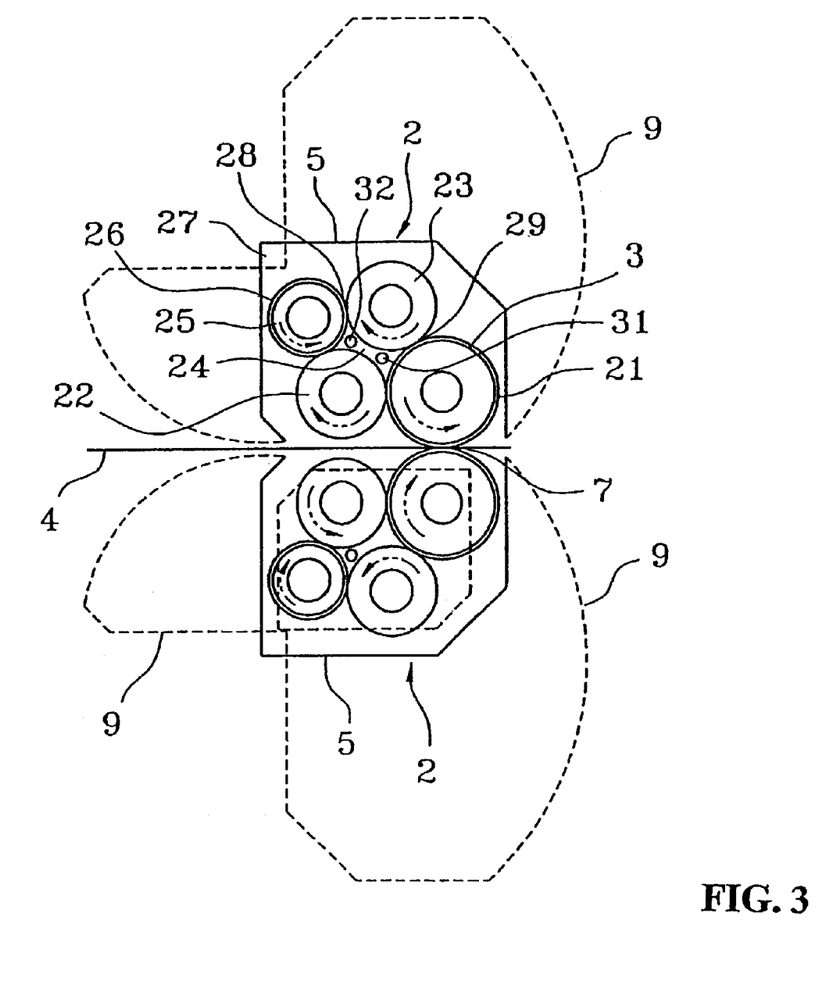
FIG. 3 shows an enlarged view of the part indicated with "A" in FIG. 2 of the board coating system, which represents the coating apparatus.

In the following a preferred embodiment of a coating apparatus 2 formed as a roller-coater is explained with the help of FIG. 3, which depicts an enlarged view of the system part which is designated in FIG. 2 as "A". As explained above the board coating apparatus 1 according to FIG. 2 comprises two coating apparati 2 which are located opposite of and, with respect to the transport path of board 4, symmetrical to one another. The coating apparatus 2, located opposite the respective other coating apparatus 2, serves simultaneously as brace 5 which, during coating, presses against board 4 from the side of board 4 opposite the respective other coating apparatus 2 in order to act against the pressure applied by the respective coating apparatus 2 during coating to the board 4. In the following only one of both of the coating apparati 2 is explained since both correspond to each other. As explained above, the coating apparatus 2 comprises a rotatably driven coating roller 3 which is vertically arranged and which moves at the contact place with the board 4 to be coated in the direction of transport of the plate 4. The coating roller 3 (or application roller) comprises a circumferential layer 21 made out of a soft synthetic material, in particular out of rubber. This circumferential layer 21 is patterned in microscopic dimensions such that the coating roller 3 can better transport the coating material supplied to it by the supply apparatus (explained below) to the board 4 which is to be coated. The core of the coating roller 3 is made of a harder material than its circumferential layer 21, wherein for example steel or a synthetic material which is harder as compared to the circumferential layer 21 is an option. The coating roller 3 can also be made completely out of the circumferential layer material. Two rollers 22 and 23 which are made completely out of steel and which are also vertically arranged are in contact with coating roller 3 such that both steel rollers 22 and 23 roll with the coating roller. The lower steel roller in FIG. 3 is provided as a doctor roller 22 and the upper steel roller in FIG. 3 is provided as a corotatory roller 23. Instead of steel, the doctor roller 22 and the corotatory roller 23 can also be made of another material, for example synthetic material, that is harder than the material of the circumferential layer 21 of the coating roller 3. The rotational axes are of the three cited rollers 3, 22 and 23 are arranged such that the connection lines between the doctor roller 22 and the coating roller 3 as well as between the corotatory roller 23 and the coating roller 3 form a tight angle, wherein the doctor roller 22 and the corotatory roller 23, however, do not rest on one another. The diameter of the doctor roller 22 is the same as the diameter of the corotatory roller 23 so that the two rollers 22 and 23 are able to rotate in contact with the coating roller such that no relative motion between the rollers 3, 22 and 23 arises. In contrast to the two steel rollers 22 and 23, the coating roller 3 has a larger diameter. A middle space 24 is formed between the thusly arranged rollers of the coating apparatus 2, which middle space is boarded by the three rollers 3, 22 and 23. A vertically arranged sealing roller 25 is provided resting on both of the steel rollers 22 and 23, which sealing roller 25 rolls with the two steel rollers 22 and 23. The four rollers 3, 22, 23 and 25 of the roller-coater are thus arranged parallel to one another. The sealing roller 25 comprises an outer layer of material which is softer relative to the material of the doctor roller 22 and the corotatory roller 23. In particular, a rubber material is provided as outer layer 26 of the sealing roller 25, while the core of the sealing roller 25 can also be made out of steel. The sealing roller 25 can, however, also be made completely out of its outer layer material. The sealing roller 25 is pressed not only against the doctor roller 22 but also against the corotatory roller 23 such that the middle space 24 is sealed towards the side against fluid. Furthermore, the corotatory roller 23 is pressed against the coating roller 3 in such a way that, also between these two rollers, no fluid can escape out towards the side. The four rollers 3, 22, 23 and 25 are supported at their lower front sides by a bearing plate 27, which is also simultaneously sealed against the front of the four rollers 3, 22, 23 and 25 so that a fluid sealed receiving space 28 is formed in which the liquid coating material 29 which is to be applied to the board 4 is taken up.

According to the present embodiment, the coating roller 3 and the sealing roller 26 are provided with positionally fixed axes, while the doctor roller 22 and the corotatory roller 23 are adjustably arranged perpendicular to the connection line between the axes of the sealing roller 25 and the coating roller 3. The corotatory roller 23 can thus be pressed with the desired contact pressure against the sealing roller 26 and the coating roller 3 in order to achieve the requisite fluid sealing. The coating roller 3 and the doctor roller 22 rotate oppositely such that they move outwardly from the receiving space 28 at their opposing contact line. In this way the coating roller 3 can easily convey coating material 29 out of the receiving space 28 outwardly in the direction of the board 4 which is to be coated. Here, the coating material 29 is picked up by the surface of the coating roller 22 in the receiving space 28 and is conveyed outwardly through the gap between the doctor roller 22 and the coating roller 3 by the coating roller 22 via its rotating motion and is finally transferred to the board 4. By setting the contact pressure of the doctor roller 22 against the coating roller 3, one can set how much coating material is conveyed out of the receiving space 28 by the coating roller 3, wherein the following applies: The higher the contact pressure, the less the coating roller 3 can convey outward and the less the layer thickness will be. Like the corotatory roller 23 and the sealing roller 25, the doctor roller 22 is formed smoothly on its outer surface so that it does not carry any fluid from the receiving space 28 outside. Adjustment of the doctor roller 22 can also lead to a change in the contact pressure between the sealing roller 25 and the doctor roller 22. In order to prevent an insufficient seal between the sealing roller and the doctor roller 22 caused in this way, the sealing roller is correspondingly firmly pressed against the doctor roller 22 in advance and/or, as shown in FIG. 3, the doctor roller 22 and the sealing roller 26 rotate oppositely such that at their connection line they move in the direction of the receiving space 28. In this way a reconveying of the fluid 29 in the receiving space 28 is favoured. Due to the smooth outer surface of the doctor roller 22, the corotatory roller 23 and the sealing roller 26 as well as due to the yielding on the side of the contact points of the sealing roller 25 which is softer in comparison to the steel rollers 22 and 23, a sufficient seal is achieved between these rollers 25, 22 and 23 so that no coating material outwardly escapes therebetween. However, should it happen that fluid escapes outwardly, this is caught by the bearing plate 27 which is located below and which for this purpose is formed as a catching container. The fluid collected by the bearing plate 27 is then fed back via a recirculation conduit 30 (see FIG. 4) to a supply container, itself not depicted.

Figure 4:
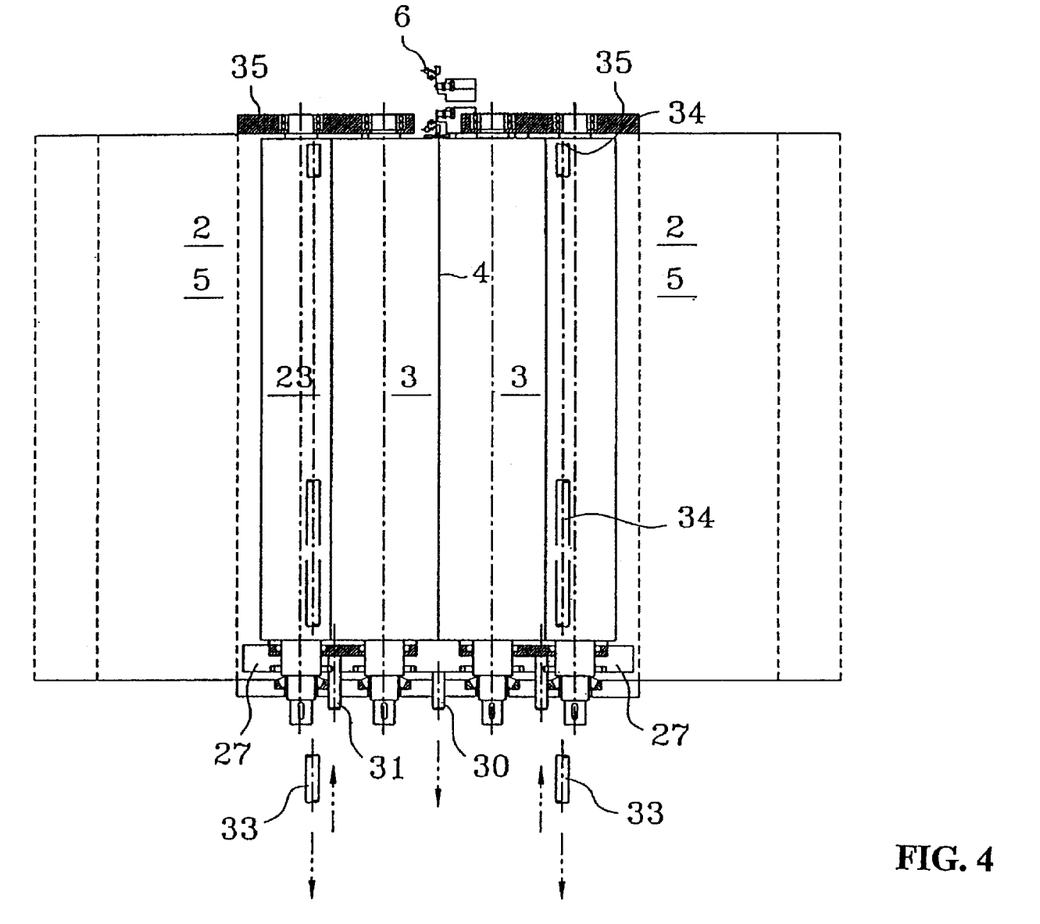
FIG. 4 shows a front view of the coating apparatus depicted in FIG. 3.

The receiving space 28 is connected via a connection line 31 with a pump (not depicted) which conveys liquid coating material 29 out of the supply container via the line 31 into the receiving space 28 in order to compensate for the material removed by the coating roller 3. Here the connection line 31 is located in the lower bearing plate 27 so that resupplied coating material enters the receiving space 28 from below. Furthermore an overflow in the form of an overflow pipe 32 is provided in the receiving space 28, which overflow pipe 32, extending vertical and thereby parallel to the longitudinal direction of the receiving space, is opened towards the top and towards the bottom is connected with the supply container via another connection line 33 which serves as a lacquer supply line. The coating fluid 29 contained in receiving space 28 can therefore rise up until it reaches the upper end 34 of the overflow pipe 32 whereby the fluid level in the receiving space 28 is exactly adjusted to the height level of the end 34 of the overflow pipe 32 by a constant resupplying of fluid from the supply container. The overflow pipe 32 is preferably variable in its length so that is possible to set various liquid levels in receiving space 28. Here the setting of the length of the overflow pipe 32 can occur in a stepwise or non-stepwise fashion. Alternatively to this, closable openings can be provided in the overflow pipe 32, wherein by opening these openings other liquid levels can correspondingly be set. As seen in FIG. 4 the rollers are supported on their upper sides by an upper bearing plate 35. The transport apparatus 6 is located above the coating apparatus 2 and thus above the rollers 3, 22, 23 and 25. In this embodiment both of the upper bearing plates 35 of both of the coating apparati 2 are located in a distance apart from one another, wherein the transport apparatus 6 extends between both of the bearing plates 35 so that the board 4 can be held by the transport apparatus 6 in a level directly above the rollers 3, 22, 23 and 25. In this way the uncoated, upper edge 8 and thus the unused part of the board 4 can be kept small. The edge 8 required for optimal transport of the board 4 is provided with a width of 6–12 mm.

Figure 5:
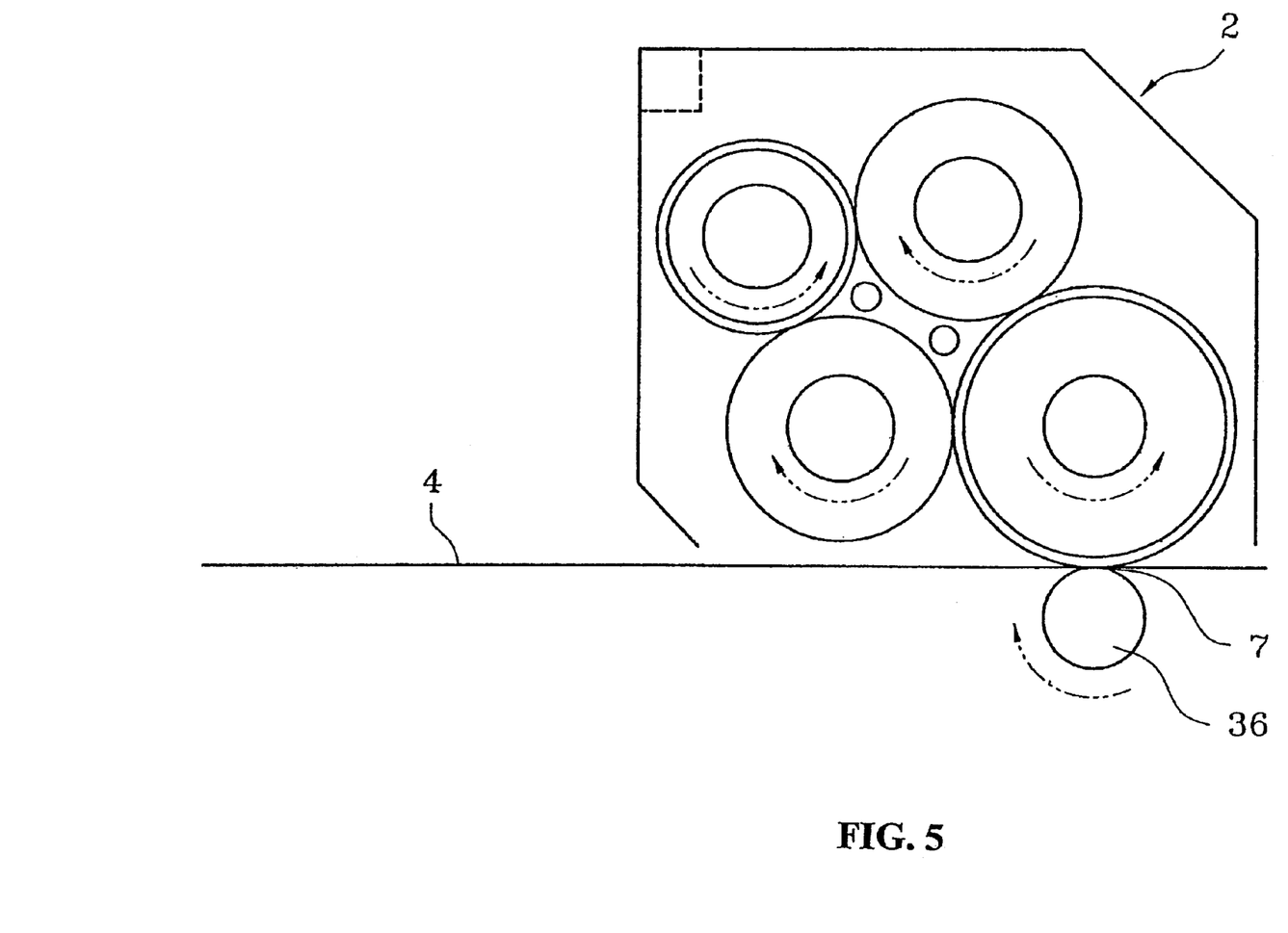
FIG. 5 shows a coating apparatus according to another embodiment.

FIG. 5 shows the portion of a board coating system 1 corresponding to the portion "A" from FIG. 2 according to another embodiment. According to this only one coating apparatus 2 is provided which corresponds to the previously described coating apparatus 2. However, located opposite this coating apparatus 2 is not a further coating apparatus, but a brace roller 36. The gap 7 is located between the coating roller 3 and the brace roller 36, through which gap the board 4, led by the transport apparatus 6, is transported. In this embodiment the board 4 is coated from one side only in one coating process.

Figure 6:
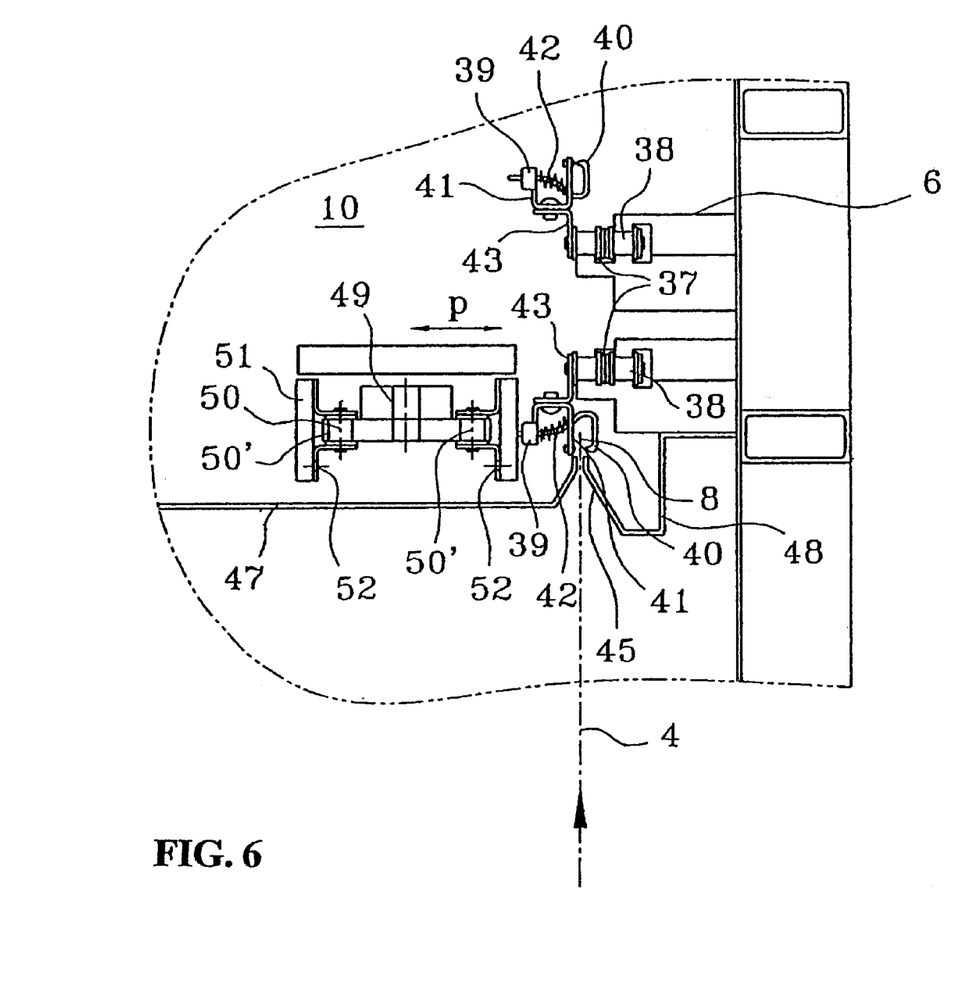
FIG. 6 shows a section among the line indicated with B—B in FIG. 2.
Figure 7:
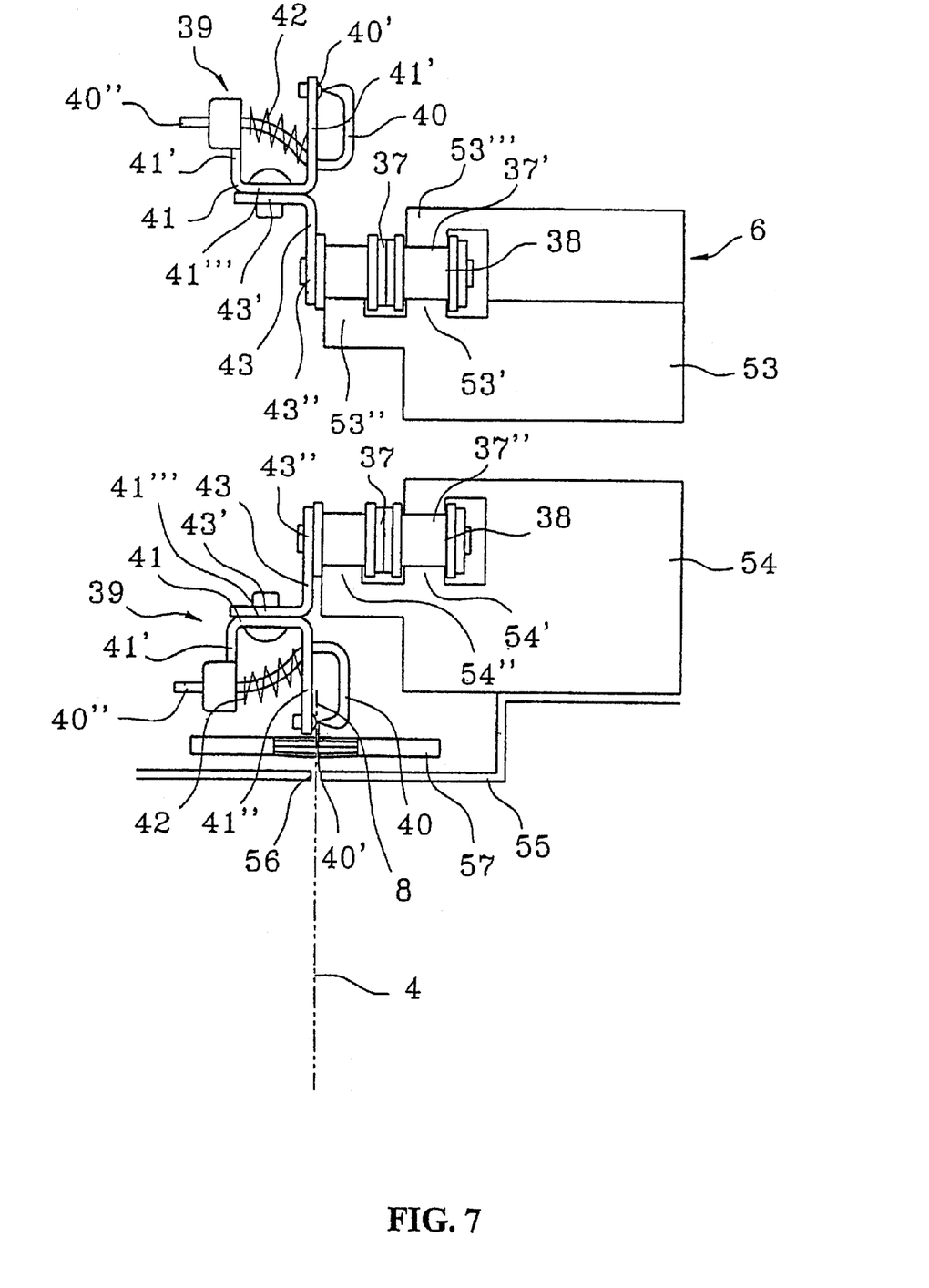
FIG. 7 shows a cutaway view of a transport apparatus in the area of the coating apparatus of the board coating system of FIG. 1.

As seen in FIG. 2 the transport apparatus 6 extends from the board supply apparatus 10 past the coating apparatus 2, a maintenance zone 44 with doors 9, the drying apparatus 14, the cooling apparatus 17 and the board removal apparatus 19 in each case above these devices and apparati. According to the embodiment shown the transport apparatus 6 is provided as a circulating transport chain 37, on whose chain links 38, as especially seen in FIGS. 6 and 7, grip apparati 39 are mounted sidewise. The respective grip apparatus 39 has a grip part 40 in the form of a hooked clip which, for example, is made out of a hook-shaped bent metal sheet or synthetic material. The grip part 40 is located in a trilateral closed frame part 41 bent in an rectangular manner, wherein the grip part 40 is arranged between both of the free and parallely running frame legs 41' and 41" of said frame part 40. The grip part 40 extends in its longitudinal direction between both of the frame legs 41' and 41" as well as through these. Both of the frame legs 41' and 41" of the angle frame 41 are connected with one another via a bridge 41''' which is attached to a leg 43' of a mounting angle 43, which itself is fastened with its second leg 43" on one of the chain links 38 by the chain link bolt. The grip part 40 is biased by means of a spring 42 such that it is biased with its one hook end 40, which is bent towards the one frame leg 41" of the frame part 41, resiliently biased against this frame leg 41". The grip part 40 extends in its longitudinal direction perpendicular to the transport chain 37; here its hook portion with the hook end 40' faces towards the transport chain 37, while its other end 40" faces away from the transport chain 37. The grip part 40 will be brought into an opening position by pushing on its end 40", which faces away from the transport chain 37, in the direction of the transport chain 37;

subsequentially a board 4 can be led between the one frame leg 41" and the hook end 40' of the grip part 40 and, following subsequent release of the grip part 40, can be fastened to the transport chain 37 in a manner such that it is clamped by the spring action of the spring 42 between the hook end 40' and the one frame leg 41".

FIG. 6 shows a cutaway through the board supply apparatus 10 along a line which is designated as B—B in FIG. 2. According to this the board supply apparatus 10 comprises a board introductory shaft 45 which is elongated in the longitudinal direction of the transport chain and which is located directly under the transport chain 37 and is tapered towards the top in the direction of the transport chain 37 in the shape of a funnel. The grip apparati 39 are located directly at the discharge end 46 so that the respective board 4 being supplied from below through the introductory shaft 45 can be gripped by the grip apparati 39 directly subsequent to the introductory shaft 45. The board introductory shaft 45 is formed by two panels 47 and 48 which are located across from one another and are bent corresponding to the funnel shape. In the present embodiment both stretches of chain 37' and 37" of the transport chain 37 run one above the other. An opening apparatus 49 is provided in the form of an opener chain 50 for opening the grip apparati 39, on which chain links force plungers 51 in the form of pressure plates, each with two angles 52, are attached. The opener chain 50 is provided as running parallel to the transport chain 37 as well as with stretches of chain 50' and 50" which are located horizontally next to one another. The opener chain 50 is completely, in other words along its entire length, moveable in the direction perpendicular to the transport chain 37 (double arrow P), such that the force plungers 51 are pushed against the ends 40" facing away from the transport chain 37 while opening the grip apparati 39. The length of the opening apparatus 49 and thereby (aproximately) half of the length of the opener chain correspond to the expected maximal length of a board 4 which is to be transported. Hence such a number of grip apparati 39 can be opened during supply of a board 4 to the transport apparatus 6 by the opener apparatus 49 that the board 4 can be gripped along its entire upper edge 8 by the grip apparati 39. The board 4 supplied by the transport apparatus 6 is, as explained above, clamped into the grip apparati 39 by driving away the opening apparatus 49 and is from then on transported by the transport chain 37 in the direction of the cleaning unit 12 and the coating apparatus 2.

The board introduction shaft 45 is tapered to a width which is smaller than or the same as the distance between the one leg 41" of the leg frame 41 and the hook end 40' of the open grip part 40. In this way it is achieved that the plate 4 which is supplied to the transport apparatus 6 can be continually introduced into the grip apparati 39 free of hinderances. In the case that the board 4 exhibits warping or curvature on its upper edge 8, these are straightened by the funnel shape of the board introduction shaft 45 and, due to the width of the introduction shaft 45 mentioned above, can never be larger than the distance between the clamping parts mentioned above (leg 41" and hook end 40') of the grip apparati 39.

FIG. 7 shows a cutaway through the transport apparatus 6 in the area of the coating apparatus 2 which is located beneath the transport apparatus 6. As can be seen in FIG. 7, the upper 37' and lower 37" stretch of chain of the transport chain 37 respectively run in a support casing 53 and 54, from which in particular the lower stretch of chain 37" on which the boards 4 hang, is supported from below over its entire transport length against against sagging as well as against twisting. In this way a more exact guiding of the plates 4 is achieved. The transport chain 37 is formed as a duplex chain in order to achieve a better support against twisting of the chain 37. The grip apparati 39 are mounted sidewise on a side of the transport chain 37 by means of their bolts. The transport chain 37 is supported from above and below between both of the link plates which are faced away from the grip apparati 39 and is supported from below on those chain bolts which are located between both of the link plates facing the grip apparati 39. The transport chain 37 is thus led securely against twisting along its stretches of chain 37' and 37" through two lower casing arms 53', 53" and 54', 54" arranged in a distance from each other as well as through an upper casing arm 53''' and 54'''. A paneling or cover 55 with a slit 56 is provided below the transport chain 37 and the grip apparati 39, through which slit 56 the board 4 which is transported by the transport apparatus 6 extends. The paneling 55 prevents particles from the transport chain 37, for example lubricants, from falling down onto the board 4, where they could lead to contaminations of the coating. According to the embodiment of FIG. 7 a brush 57 is provided located directly above the slit 56 on both sides of the board 4, which brush 57 contacts the board 4 on its upper edge 8 so that the slit 56 additionally seals against the escape of particles. This brush 57 is in particularly arranged in the area of the coating apparatus 2.

Figure 8:
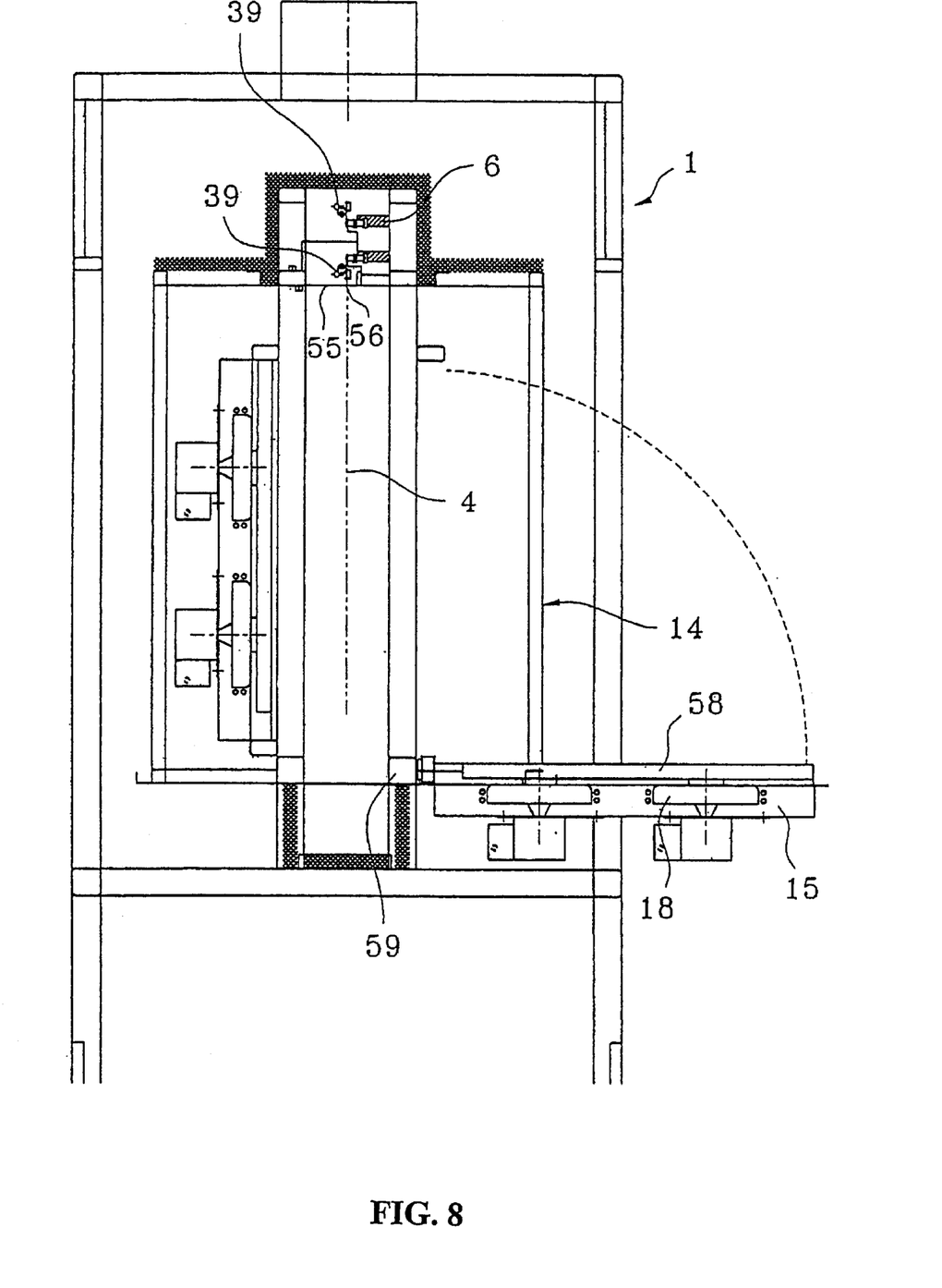
FIG. 8 shows a cutaway view along the line designated as C—C in FIG. 2.

FIG. 8 shows a cutaway along the line designated in FIG. 2 as C—C and hence a cutaway through the drying apparatus 14. As is seen in FIG. 8 the drying elements 15 are arranged in panels 58 which are hinged onto the machine frame 59 of system 1 on their undersides so that they can be swung down out of the way. The respective heating parts 18 are arranged in the panels 58.

The components of the board coating system 1 are in total arranged within the machine frame 59 and, as one needs, can simply be removed from it and replaced by other components. Furthermore the machine frame 59 can at option be extended and outfitted with further components.

The control and maintenance zone 44 between the coating apparatus 2 and the drying apparatus 14 is preferably ventilated so as not to endanger the operator with solvent vapors during maintenance work. Other devices belonging to the coating apparatus 2, as for example the coating material pump, a thermostat for adjusting the temperature of the coating material for the purpose of regulating its viscosity, the lacquer supply container and a solvent container for the supplying of solvent to the coating material are arranged adjacent to the coating apparatus 2 in system frame 59 and are accessible from the maintenance and control zone 44.

What is claimed is:

1. A board coating system for coating a board with a liquid coating material including a coating apparatus which comprises a coating roller for applying the coating material to one side of the board, further including a brace which is arranged opposite the coating apparatus and which, during the coating, acts from the other side of the board against force applied to the board by the coating roller, and a transport apparatus by which, during the coating, the board, in contact with the coating roller, is transported through a gap between the coating roller and the brace, wherein the transport apparatus is formed such that the board gripped on its upper edge in a vertically hanging manner by the transport apparatus is led past the coating roller in this vertically hanging position to be coated, and wherein the coating apparatus is formed as a vertical coating apparatus with a vertically oriented coating roller and further comprises:

a vertically arranged doctor roller which is in contact with the coating roller;

a vertically arranged co-rotating roller which sealingly rests on the coating roller and which is arranged at such a distance from the doctor roller that between the co-rotating roller, the doctor roller and the coating roller a tri-laterally closed cavity is formed;

a sealing roller arranged in contact not only against the doctor roller, but also against the co-rotating roller while sealing the cavity sidewise; and a frontal seal by which the cavity on an underfrontal side of the rollers is sealed, whereby a receiving space for the liquid coating material is formed.

2. A board coating system according to claim 1, wherein the doctor roller is adjustably arranged with varying contact pressure against the coating roller to adjust the coating thickness.

3. A board coating system according to claim 1, the coating apparatus further comprising: a supply container for the liquid coating material from which coating material is supplied to the receiving space, and an adjustable overflow for setting the fluid level in the receiving space, over which overflow the excess coating material is recycled to the supply container.

4. A board coating system according to claim 1, wherein the receiving space is provided with a cooling and/or a heating apparatus by which the liquid coating material received in the receiving space can be cooled or warmed for adjustment of its viscosity.

5. A board coating system according to claim 1, wherein the coating apparatus comprises a driving apparatus by means of which all four rollers is simultaneously driven.

6. A board coating system according to claim 1, wherein the coating roller is obliquely arranged with respect to the board to be coated with upwardly increasing separation from the board.

7. A board coating system according to claim 1, wherein the doctor roller can be located upwardly inclined away from the coating roller so that, towards the top, it is pressed with decreasing pressure against the coating roller.

8. A board coating system according to claim 1, wherein the co-rotating roller is adjustably arranged for varying the required contact pressure against the coating roller.

9. A board coating system according to claim 1, wherein both the doctor roller and the co-rotating roller are, for adjusting the required contact pressures, repositionably arranged in the direction perpendicular to the connecting line between the sealing roller and the coating roller.

10. A board coating system according to claim 1, wherein the doctor roller and the co-rotating roller have the same diameter.

11. A board coating system according to claim 1, wherein the coating roller and the sealing roller have an outer surface made out of plastic material, and wherein the doctor roller and the co-rotating roller are provided as steel rollers.

12. A board coating system according to claim 1, wherein the coating roller at its outer surface is structured such that the liquid coating material is transported at its outer surface to the top due to the rotating movement of the coating roller.

13. A board coating system according to claim 1, wherein the brace is formed as a brace roller.

14. A board coating system according to claim 1, wherein the brace is provided as a second coating apparatus corresponding to the first coating apparatus so that the board can be simultaneously coated on both sides.

15. A board coating system according to claim 1, wherein the coating apparatus and/or the brace is adjustably arranged in the direction perpendicular to the board.

16. A board coating system according to claim 1, wherein the transport apparatus is formed as a transport apparatus lying completely on top.

17. A board coating system according to claim 1, wherein the transport apparatus is formed such that the board is gripped along its entire upper edge by the transport apparatus.

18. A board coating system according to claim 1, further comprising an automatic board supply apparatus by means of which boards are supplied to the transport apparatus.

19. A board coating system according to claim 18, wherein the board supply apparatus and the transport apparatus are formed such that a respective board is simultaneously gripped along its entire upper edge when hanging it to the transport apparatus.

20. A board coating system according to claim 18, wherein the board supply apparatus comprises a board introductory shaft through which the board of the transport apparatus is supplied, wherein the board introductory shaft is formed, towards to the top, in a tapered funnel shaped manner and discharges immediately adjacent to gripping apparati of the transport apparatus, so that a respective board with a straightened upper edge is fed directly to the gripping apparati of the transport apparatus.

21. A board coating system according to claim 1, further comprising an automatic board removal apparatus by means of which the board is removed from the transport apparatus.

22. A board coating system according to claim 21, wherein the board removal apparatus and the transport apparatus are formed such that a respective board is simultaneously released along its entire upper edge when removing it from the transport apparatus.

23. A board coating system according to claim 1, wherein the transport apparatus is provided as a circulating transport chain, on whose chain links the gripping apparati are mounted for gripping the board.

24. A board coating system according to claim 23, further comprising an automatic board supply apparatus by means of which boards are supplied to the transport apparatus, wherein the board supply apparatus comprises an opener chain on which chain links force plungers are provided, the opener chain is arranged in parallel to the transport chain and is running with its velocity, wherein the gripping apparati comprise gripping parts which are elastically biased in their closing direction and wherein the opener chain can be pressed against the grip apparati with the force plungers of the opener chain while opening the grip parts.

25. A board coating system according to claim 23, further comprising an automatic board removal apparatus by means of which the board is removed from the transport apparatus, wherein the board removal apparatus comprises an opener chain on which chain links force plungers are provided, the opener chain is arranged in parallel to the transport chain and is running with its velocity, wherein the gripping apparati comprise gripping parts which are electrically biased in their closing direction and wherein the opener chain can be pressed against the grip apparati with the force plungers of the opener chain while opening the grip parts.

26. A board coating system according to claim 1, further comprising a drying apparatus for drying the coating material applied onto the respective board by the coating apparatus wherein the board is transported at its upper edge by the transport apparatus through the drying apparatus in a vertically hanging position.

27. A board coating system according to claim 1, further comprising a cooling apparatus for cooling the coating material applied onto the board by the coating apparatus, wherein the board is transported at its upper edge through the cooling apparatus by the transport apparatus in a vertical hanging position.

28. A board coating system according to claim 1, further comprising a cleaning unit for cleaning the board to be coated, which cleaning unit is arranged in the transport direction of the board being seen from the coating apparatus, wherein the transport apparatus is formed such that the board is transported in vertically hanging position at the transport apparatus through the cleaning unit for cleaning the board.

29. Coating apparatus for coating a board with a liquid coating material comprising a vertically arranged coating roller for applying the coating material to one side of the board, a vertically arranged doctor roller which is in contact with the coating roller, a vertically arranged co-rotating roller which sealingly rests on the coating roller and which is arranged at such a distance from the doctor roller that between the co-rotating roller, the doctor roller and the coating roller a tri-laterally closed cavity is formed, a sealing roller arranged in contact not only against the doctor roller, but also against the co-rotating roller while sealing the cavity sidewise, and a frontal seal by which the cavity on an underfrontal side of the rollers is sealed while forming a receiving space for the liquid coating material.

30. A board coating system according to claim 29, wherein the doctor roller is adjustably arranged with varying contact pressure against the coating roller to adjust the coating thickness.

31. A board coating system according to claim 29, the coating apparatus further comprising: a supply container for the liquid coating material from which coating material is supplied to the receiving space, and an adjustable overflow for setting the fluid level in the receiving space, over which overflow the excess coating material is recycled to the supply container.

32. A board coating system according to claim 29, wherein the receiving space is provided with a cooling and/or a heating apparatus by which the liquid coating material received in the receiving space can be cooled or warmed for adjustment of its viscosity.

33. A board coating system according to claim 29, wherein the coating apparatus comprises a driving apparatus by which each of all four rollers is simultaneously driven.

34. A board coating system according to claim 29, wherein the coating roller is obliquely arranged with respect to the board to be coated with upwardly increasing separation from the board.

35. A board coating system according to claim 29, wherein the doctor roller can be located upwardly inclined away from the coating roller so that, towards the top, it is pressed with decreasing pressure against the coating roller.

36. A board coating system according to claim 29, wherein the co-rotating roller is adjustably arranged for varying the required contact pressure against the coating roller.

37. A board coating system according to claim 29, wherein both the doctor roller and the co-rotating roller are, for adjusting the required contact pressure, repositionably arranged in the direction perpendicular to the connecting line between the sealing roller and the coating roller.

38. A board coating system according to claim 29, wherein the doctor roller and the co-rotating roller have the same diameter.

39. A board coating stem according to claim 29, wherein the coating roller and the sealing roller have an outer surface made out of plastic material, and wherein the doctor roller and the co-rotating roller are provided as steel rollers.

40. A board coating system according to claim 29, wherein the coating roller at its outer surface is structured such that the liquid coating material is transported at its outer surface to the top due to the rotation movement of the coating roller.

* * * * *

UNITED STATES PATENT AND TRADEMARK OFFICE
CERTIFICATE OF CORRECTION

PATENT NO. : 6,344,087 B2
DATED : February 5, 2002
INVENTOR(S) : Hein

It is certified that error appears in the above-identified patent and that said Letters Patent is hereby corrected as shown below:

Column 9,
Lines 34-35, the word "among" should read -- along -- and the phrase "with B-B" should be replaced with the phrase -- as item 60 --.
Line 40, the term "C-C" should be replaced with the phrase -- item 80 --.

Column 15,
Line 8, the term "B-B" should be replaced with the phrase -- item 60 --.
Line 28, the term "C-C" should be replaced with the phrase -- item 80 --.

Signed and Sealed this

Fifteenth Day of February, 2005

JON W. DUDAS
*Director of the United States Patent and Trademark Office*